US009380720B2

(12) United States Patent
Thielemans et al.

(10) Patent No.: US 9,380,720 B2
(45) Date of Patent: Jun. 28, 2016

(54) HINGED CONNECTOR AND MODULAR VIDEO DISPLAY ASSEMBLY CONTAINING SAME

(71) Applicant: REVOLUTION DISPLAY, LLC, Glendale, CA (US)

(72) Inventors: Robbie Thielemans, Nazareth (BE); Tony Van Moorleghem, Ghent (BE); Jeremy Hochman, Glendale, CA (US)

(73) Assignee: Revolution Display, LLC, Glendale, CA (US)

( * ) Notice: Subject to any disclaimer, the term of this patent is extended or adjusted under 35 U.S.C. 154(b) by 285 days.

(21) Appl. No.: 14/165,327

(22) Filed: Jan. 27, 2014

(65) Prior Publication Data

US 2014/0211424 A1    Jul. 31, 2014

Related U.S. Application Data

(60) Provisional application No. 61/757,084, filed on Jan. 25, 2013.

(51) Int. Cl.
| | |
|---|---|
| *H05K 7/00* | (2006.01) |
| *H05K 5/02* | (2006.01) |
| *H05K 7/02* | (2006.01) |
| *F16M 11/08* | (2006.01) |
| *F16M 13/02* | (2006.01) |
| *G09F 9/302* | (2006.01) |
| *G06F 1/16* | (2006.01) |

(52) U.S. Cl.
CPC ............. *H05K 5/0226* (2013.01); *F16M 11/08* (2013.01); *F16M 13/02* (2013.01); *G06F 1/1601* (2013.01); *G09F 9/3026* (2013.01); *H05K 7/02* (2013.01); *F16M 2200/063* (2013.01); *Y10T 16/52* (2015.01); *Y10T 16/535* (2015.01)

(58) Field of Classification Search
USPC ................ 361/728–730, 755, 810, 679.04, 361/679.05, 679.06, 679.12, 679.27
See application file for complete search history.

(56) References Cited

U.S. PATENT DOCUMENTS

| 5,824,007 | A | * | 10/1998 | Faraz | ............... | A61B 19/26 600/102 |
| 6,059,255 | A | | 5/2000 | Rosen et al. | | |
| 8,083,189 | B2 | * | 12/2011 | Sun | ............... | F16M 11/08 248/122.1 |
| 8,353,199 | B1 | * | 1/2013 | Ma | ............... | B64F 5/0045 108/136 |
| 2003/0015632 | A1 | | 1/2003 | Dunn et al. | | |
| 2006/0278234 | A1 | * | 12/2006 | Maatta | ............... | G06F 1/1616 128/206.19 |
| 2009/0065667 | A1 | | 3/2009 | Bakkom et al. | | |

FOREIGN PATENT DOCUMENTS

| CN | 201957366 | 8/2011 |
| JP | 2006133416 A | 5/2006 |
| WO | 2006014051 A1 | 2/2006 |

OTHER PUBLICATIONS

International Search Report and Written Opinion dated Jun. 3, 2014, in corresponding International Application No. PCT/US2014/013231, filed Jan. 27, 2014.

* cited by examiner

*Primary Examiner* — Hung S Bui
(74) *Attorney, Agent, or Firm* — Downs Rachlin Martin PLLC (57) ABSTRACT

Disclosed are a hinged connector and a video display assembly containing an attachment panel having a front surface and a back surface, with a video display attached to the front surface and at least one hinged connector attached to the back surface.

13 Claims, 7 Drawing Sheets

HINGED CONNECTOR AND MODULAR VIDEO DISPLAY ASSEMBLY CONTAINING SAME

RELATED APPLICATION

This application claims priority from U.S. Provisional Application Ser. No. 61/757,084, filed on Jan. 25, 2013, entitled "HINGED VIDEO DISPLAY MODULE ASSEMBLY," the entirety of which is incorporated herein by this reference.

BACKGROUND

1. Field

This invention relates to the mechanical and electrical arts. In particular, it relates to a hinged connector and a modular video display assembly employing the hinged connector.

2. Background

Viewers of musical concerts and other theatrical performances have come to expect more and more of the visual component accompanying the audio experience. To satisfy this expectation, it is known to provide large video displays comprised of an array of modular video display assemblies. To optimize the quality of the image shown on the large video display it is a desideratum that adjacent assemblies be seamlessly attached to one another. Typically, effective and seamless connectors have limited large displays to planar displays. However, there is a long felt need for the flexibility provided by a hinged connector, so that adjacent assemblies cannot only be effectively attached in a seamless planar orientation, but may be effectively attached in other orientations.

SUMMARY OF THE INVENTION

Now in accordance with the invention, there has been found a hinged connector and a video display module assembly employing the hinged connector that provide these and related advantages. In one aspect of the invention, a hinged connector comprises a first base and a second base. In one aspect the first base has a first base body and the first base body comprises a first first base hinge having first a first end and a second end, where the first end is pivotably attached to the first base body and a second first base hinge having a first end and a second end, where the first end is pivotably attached to the first base body. And in one aspect, the second base comprises a second base body comprising a first second base hinge having a first end and a second end, where the first end is pivotably attached to the base body and a second second base hinge having a first end and a second end, where the first end is pivotably attached to the base body, and where the second end of the first first base hinge is pivotably attached to the second end of the second second base hinge, the second end of the second first base hinge is pivotably attached to the second end of the first second base hinge, and the second first base hinge is pivotably attached to the second base hinge.

In one aspect, the first base body has planar opposing sides, the first end of the first first base hinge has spaced apart arms pivotably attached to the planar opposing sides of the first base body and the first end of the second first base hinge has spaced apart arms pivotably attached to the planar opposing sides of the first base body. And in one aspect, the second base body has planar opposing sides, the first end of the first second base hinge has spaced apart arms pivotably attached to the planar opposing sides of the second base body and the first end of the second second base hinge has spaced apart arms pivotably attached to the planar opposing sides of the second base body.

In one aspect, the second end of the first first base hinge has first and second opposing planar sides; the second end of second second base hinge has a pair of spaced apart arms pivotably attached to the first and second opposing planar sides of the second end of the first first body hinge; the second end of the second first base hinge has first and second opposing planar sides and the second end of the first second base hinge has a pair of spaced apart arms pivotably attached to the first and second opposing planar sides of the second first base hinge.

In one aspect, the first base further comprises a first base attachment flange and the second base further comprises a second base attachment flange. And in one aspect, at least one of the attachment flanges further comprises at least one locating peg extending the attachment flange.

And in one aspect, a modular video display assembly comprises an attachment panel having a front surface, a back surface and a perimeter surface, with a video display attached to the front surface and at least one hinged connector attached to the back surface.

In one aspect, the video display is an LED display, an LCD display, plasma display or an OLED display. And in one aspect, the LED display comprises a plurality of LED tiles.

In one aspect of the invention, the hinged connector comprises a first base and a second base. In one aspect the first base has a first base body and the first base body comprises a first first base hinge having first a first end and a second end, where the first end is pivotably attached to the first base body and a second first base hinge having a first end and a second end, where the first end is pivotably attached to the first base body. And in one aspect, the second base comprises a second base body comprising a first second base hinge having a first end and a second end, where the first end is pivotably attached to the base body and a second second base hinge having a first end and a second end, where the first end is pivotably attached to the base body, and where the second end of the first first base hinge is pivotably attached to the second end of the second second base hinge, the second end of the second first base hinge is pivotably attached to the second end of the first second base hinge, and the second first base hinge is pivotably attached to the second base hinge.

In one aspect, the first base body has planar opposing sides, the first end of the first first base hinge has spaced apart arms pivotably attached to the planar opposing sides of the first base body and the first end of the second first base hinge has spaced apart arms pivotably attached to the planar opposing sides of the first base body. And in one aspect, the second base body has planar opposing sides, the first end of the first second base hinge has spaced apart arms pivotably attached to the planar opposing sides of the second base body and the first end of the second second base hinge has spaced apart arms pivotably attached to the planar opposing sides of the second base body.

In one aspect, the second end of the first first base hinge has first and second opposing planar sides; the second end of second second base hinge has a pair of spaced apart arms pivotably attached to the first and second opposing planar sides of the second end of the first first body hinge; the second end of the second first base hinge has first and second opposing planar sides and the second end of the first second base hinge has a pair of spaced apart arms pivotably attached to the first and second opposing planar sides of the second first base hinge.

In one aspect, the first base further comprises a first base attachment flange and the second base further comprises a second base attachment flange. And in one aspect, at least one of the attachment flanges further comprises at least one locating peg extending the attachment flange.

In one aspect, the at least one connector is attached adjacent the perimeter surface. And in one aspect, the perimeter surface is comprised of a top surface, an opposing bottom surface, a first side surface and an opposing second side surface.

In one aspect, at least one retractable alignment pin extends outwardly from the top surface, the opposing bottom surface, the first side surface or the opposing second side surface of the attachment panel. And in one aspect, at least one complementary alignment pin receiving surface, aligned with the at least one retractable alignment pin, extends inwardly from an opposing side surface.

In one aspect, the first base body contains at least one locating pin extending downwardly from the first base body and, in one aspect, the bottom of the attachment panel contains at least one locating pin hole positioned to receive the locating peg. In another aspect, the bottom on the attachment panel further comprises at least one attachment plate and the first base is attached to the attachment panel by the attachment plate. In one aspect, the attachment plate contains at least one locating pin hole positioned to receive the locating peg and align the first base and, in one aspect, the attachment plate contains two locating pin hole positioned to receive the locating peg and align the first base in alternate orientations.

BRIEF DESCRIPTION OF THE DRAWINGS

The accompanying drawings, together with the specification, illustrate exemplary embodiments, and, together with the description, serve to explain the principles of these embodiments.

DETAILED DESCRIPTION OF THE PREFERRED EMBODIMENTS

Particular embodiments of the invention are described below in detail for the purpose of illustrating its principles and operation. However, various modifications may be made, and the scope of the invention is not limited to the exemplary embodiments described below.

Figure 1:
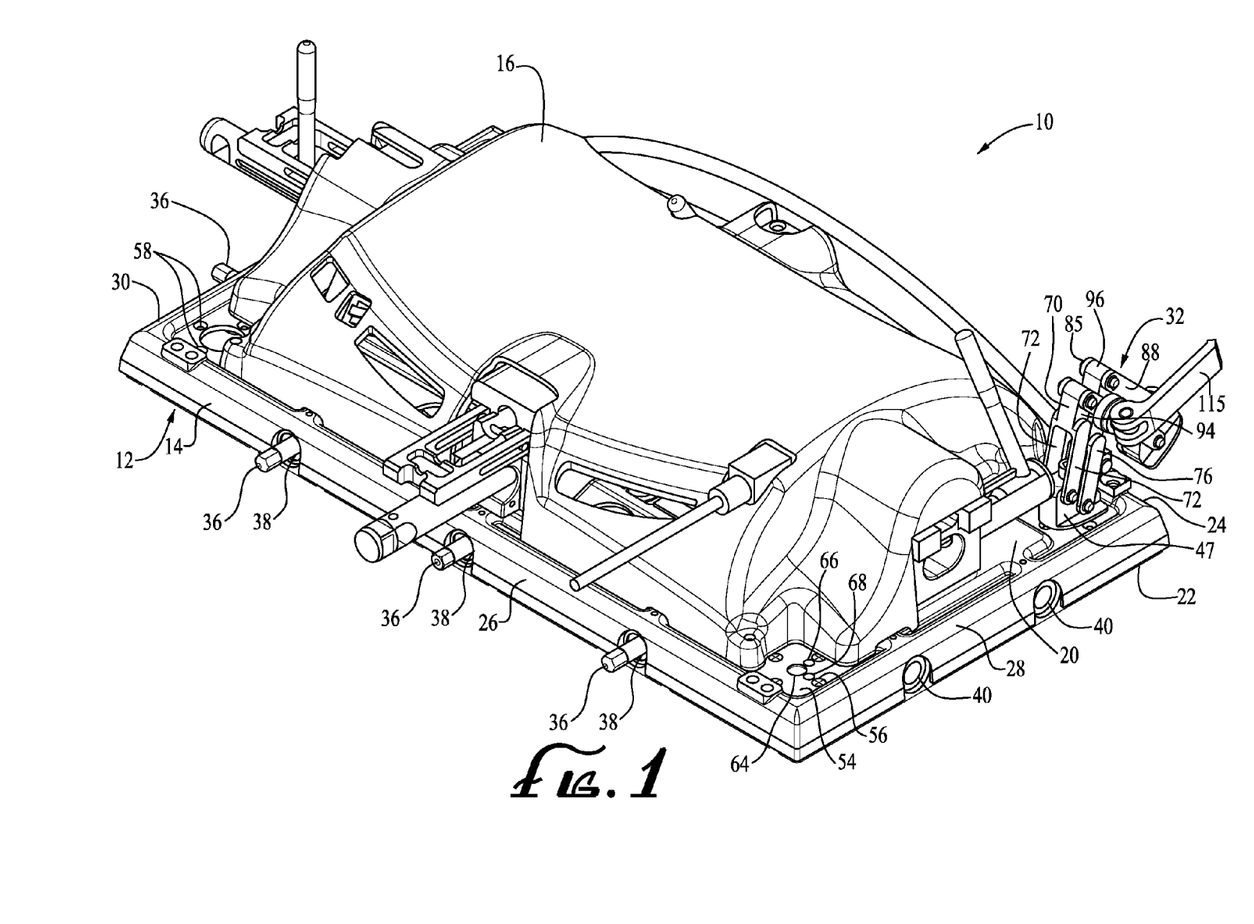
FIG. 1 is back perspective view of a video display assembly, including a hinged connector, in accordance with one aspect of the invention.
Figure 4:
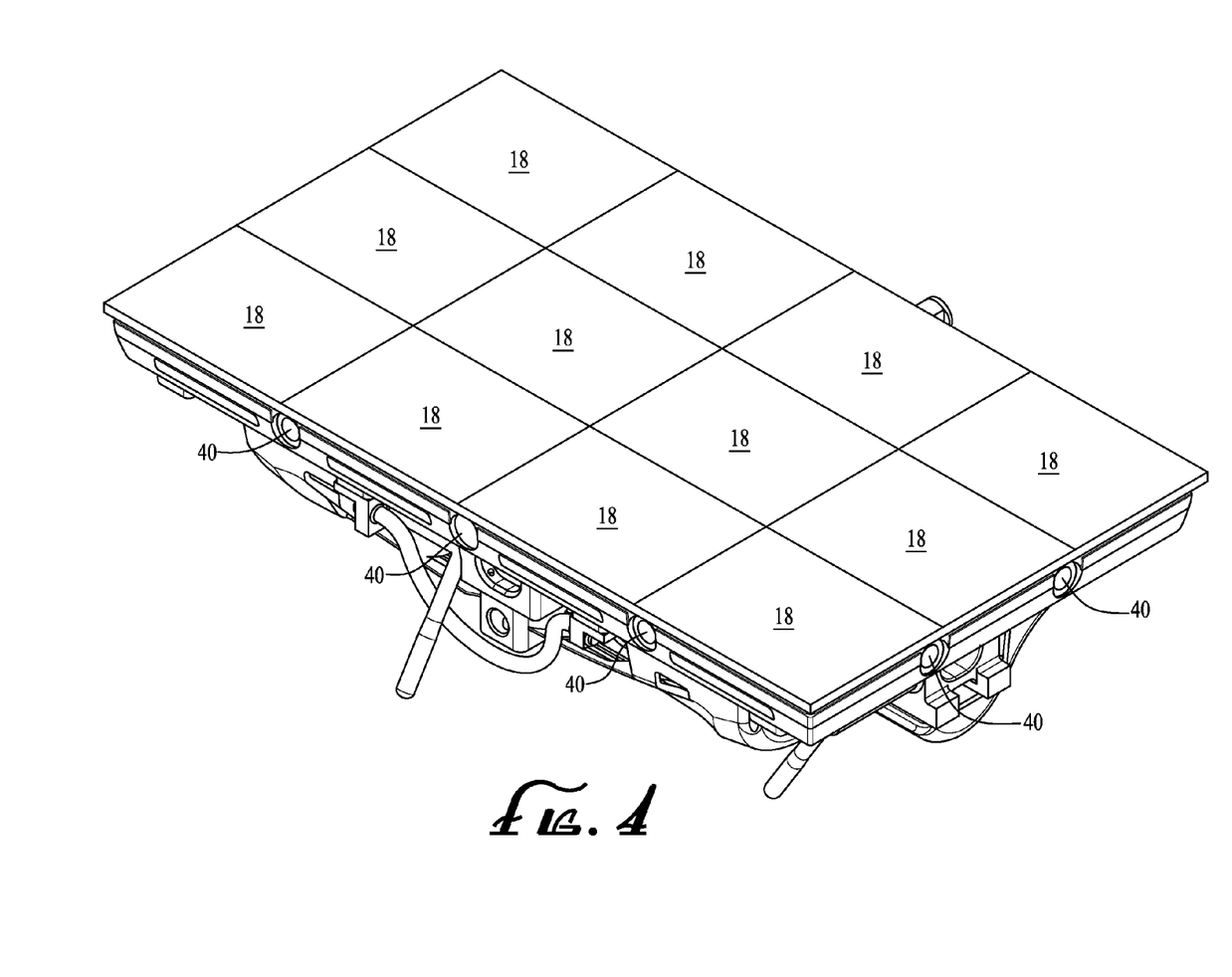
FIG. 4 is front perspective view of the video display assembly shown in FIG. 1.

Shown in FIG. 1 is back perspective view of a modular video display assembly 10, including a video display module 12 comprised of an attachment panel 14, a housing 16 and at least one video display 18 (FIG. 4).

The attachment panel includes a back, having a back surface 20, and a front, having an opposing front surface 22 and a perimeter surface. In the representative embodiment shown in FIGS. 1-5, the perimeter surface is substantially rectangular and is defined by a top surface 24, an opposing bottom surface 26, a first side surface 28 and a second side surface 30. As will be appreciated by one skilled in the art, the perimeter surface is not limited to a rectangular surface, but may have any suitable shape, such a square perimeter surface.

The attachment panel is made of any suitable material. Representative materials include, without limitation, metals, such as stainless steel, engineering plastics, fiberglass, tegris and carbon fiber materials. In one aspect the back of the attachment panel is covered by a housing 16.

The video display may be any suitable video display. Representative video displays include, without limitation LED displays, LCD displays, plasma displays, OLED displays and the like. In the embodiment shown in FIG. 4, the display comprises a plurality of LED tiles 18 secured to the attachment plate 14.

In the representative embodiment shown in FIG. 1, a pair of hinged connectors 32 and 35 (FIGS. 3A-C) shown) are secured to the back surface 20 adjacent at least one perimeter surface. In the representative embodiment shown in FIG. 1, one of the hinged connectors is secured to each corner of the first side of the attachment panel 14.

And in some aspects, at least one retractable alignment pin 36 extends outwardly from the perimeter surface. In the representative embodiment shown in FIGS. 1 and 5, three retractable alignment pins 36 extend outwardly from three alignment pin openings 38 in the bottom surface 26 of the attachment panel. An additional two alignment pins 36 extend outwardly from two alignment pin openings 38 in the second side surface 30 of the attachment panel (FIGS. 3A-C and 5).

In some aspects, at least one complementary alignment pin receiving surface, aligned with the at least one retractable alignment pin, extends inwardly from an opposing side surface. In the representative embodiment shown in FIGS. 1, 3A-C, 4 and 5, three complementary alignment pin receiving surfaces 40 extend inwardly into the top surface 24 of the attachment panel and two complementary alignment pin receiving surfaces 40 extend inwardly into the first side surface 28. The hinged connectors and the retractable alignment pins and the alignment pin receiving surfaces are made of any suitable material, such as stainless steel.

Figure 2:
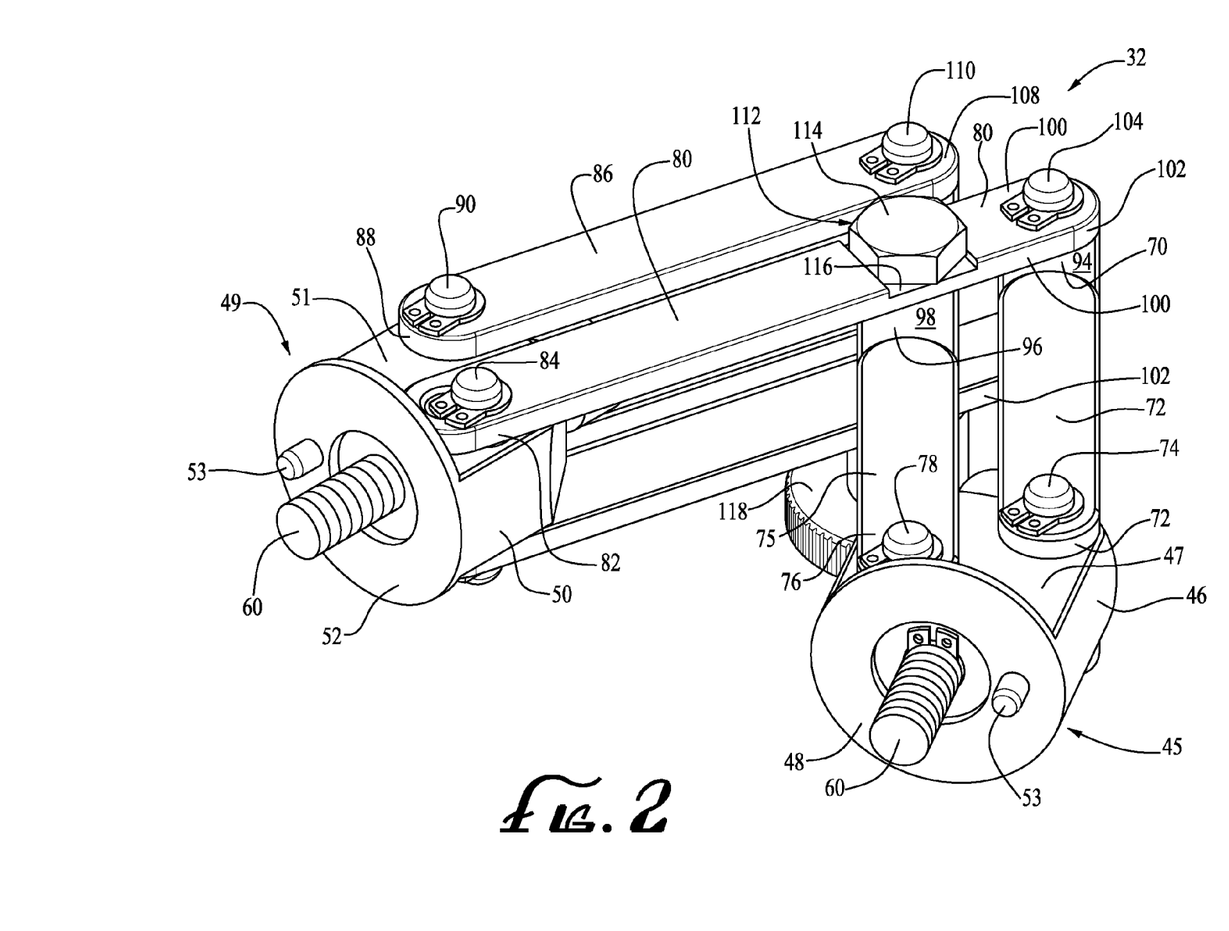
FIG. 2 is a perspective view of the hinged connector shown in FIG. 1 in accordance with one aspect of the invention.

Shown in FIG. 2 is a perspective view of one embodiment of a hinged connector 32 in accordance with the invention. In the representative embodiment shown in FIG. 2, the connector includes a first base 45 having a first base body 46 and a second base 49 having a second base body 50.

The first base 45 and the second base 49 can be attached to a first video display module and a second video display module. In some embodiments, the first base includes a first base body 46 with a first base attachment flange 48 for securing the connector to the attachment panel of the first video display module and the second base body 51 has a second base body 50 with a second base flange 52 for securing the connector to a second video display module. A locating peg 53 extends downwardly from each attachment flange. In alternative embodiments, each attachment flange contains zero or more locating pegs.

Returning to FIG. 1, the each connector 32 is attached to the attachment panel 14 using an attachment plate 54, such as an attachment plate made of stainless steel. In the embodiment shown in FIG. 1, the attachment plate is fixed to the attachment panel using four screws 56 that extend through attachment panel screw holes (not shown) into threaded holes 58 in the attachment panel. The connector is attached to the attachment plate with a screw 60 that extends through an attachment bore (not shown) in the base 62 and mates with a threaded attachment bore 64 in the attachment plate.

The attachment plate 54 contains a locating pin hole 66 to receive the locating peg 53 and align the connector 32 when the connector is secured to the plate. In the embodiment shown in FIG. 1, the locating peg is placed to align the connector when then the top surface 24 of a first attachment panel is connected to the bottom surface of a second attachment panel.

In some embodiments, the attachment plate 54 contains an additional locating pin hole 68 to receive the locating peg 53, when the connector 32 is rotated ninety degrees. In such embodiments, the connector can be secured to the attachment plate in a position such that the locating peg aligns the first side 28 of a first attachment panel 14 with the second side 30 of a second attachment panel when the first attachment panel is connected to the second attachment panel.

As seen, for example, in FIGS. 1, 2 and 3A-C, in some aspects, the first base body 46 has first and second opposing planar sides 47 (one shown) with first and second pivot bores (not shown) extending from one planar side to the other. Pivotably attached to the first base body 46 is a first first base hinge 70 having first and second opposing ends. The first opposing end is comprised of a pair of spaced apart arms 72, each arm having a pivot bore (not shown) in its distal end. The distance between the arms is substantially the same as the distance between the parallel surfaces 47, so that first first base hinge is pivotally attached to the first base by a first pivot pin 74 extending through the first pivot bore in the first base body and the spaced apart arms.

Additionally, rotatably attached to the first base body 45 is a second first base hinge 75 having first and second opposing ends. The first opposing end is comprised of a pair of spaced apart arms 76, each arm having a pivot bore (not shown) in its distal end. The distance between the arms is substantially the same as the distance between the parallel surfaces, so that second first base hinge is pivotally attached to the first base by a pivot pin 78 extending through the second pivot bore in the first base body and the pivot bores in the spaced apart arms.

In the representative embodiment shown in FIGS. 1, 2 and 3A-C, the second base body 50 has first and second opposing planar sides 51 (one shown) with first and second pivot bores (not shown) extending from one planar side to the other. Pivotably attached to the second base body 50 is a first second base hinge 80 having first and second opposing ends. The first opposing end is comprised of a pair of spaced apart arms 82, each arm having a pivot bore (not shown) in its distal end. The distance between the arms is substantially the same as the distance between the parallel surfaces 51, so that first second base hinge is pivotally attached to the second base by a first pivot pin 84 extending through the first pivot bore in the second base body and the pivot bores in the spaced apart arms.

Additionally, rotatably attached to the second base body is a second first base hinge 86 having first and second opposing ends. The first opposing end is comprised of a pair of spaced apart arms 88, each arm having a pivot bore (not shown) in its distal end. The distance between the arms is substantially the same as the distance between the parallel surfaces, so that second first base hinge is pivotally attached to the second base by a pivot pin 90 extending through the second pivot bore in the second base body and the pivot bores in the spaced apart arms The second end of the first first base hinge 70 has planar opposing sides 94, oriented in planes parallel to the planes of the parallel surfaces 47. The first first base hinge includes a pivot bore (not shown) disposed at the distal end. The second end of the second first base hinge 75 has planar opposing sides 98 oriented in planes parallel to the planes of the parallel surfaces 47. The second first base hinge includes a pivot bore (not shown) disposed at the distal end.

The second end of the first second base hinge 80 comprises a pair of spaced apart arms 102, each arm having a pivot bore (not shown) in its distal end. The distance between the arms is substantially the same as the distance between the planar opposing sides 94 of the second end of the first first base hinge 70, so that first second base hinge is pivotally attached to the first first base hinge by a pivot pin 104 extending through the pivot bore in the second end of the first first base hinge and the pivot bores in the spaced apart arms.

The second end of the second second base hinge 86 comprises a pair of spaced apart arms 108, each arm having a pivot bore (not shown) in its distal end. The distance between the arms is substantially the same as the distance between the opposing sides 98 of the second end 96 of the second first base hinge 75, so that second second base hinge is pivotally attached to the second first base hinge by a pivot pin 110 extending through the pivot bore in the second end of the second first base hinge and the bores in the spaced apart arms.

In the representative embodiment shown in FIGS. 1, 2 and 3A-C, the body 98 of the second first hinge 75 contains a second pivot bore (not shown) that is aligned with a pair of second pivot bores (not shown) in arms 102 of the first second base hinge 80 and the second first hinge is pivotally connected to the first second base hinge by a bolt 112 extending through the bores. The bolt has a head 114 secured in a recess 116 in the adjacent arm. The threaded end of the bolt is threadably secured to a handle 118.

Figure 3A:
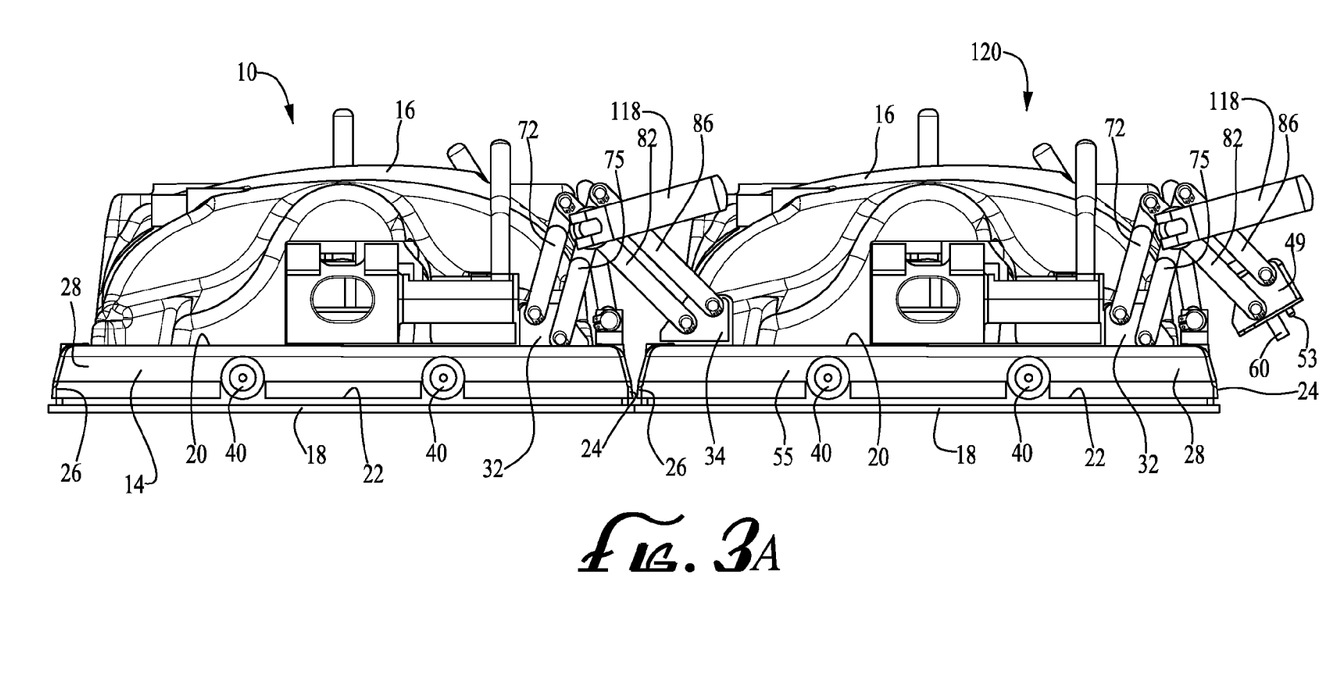
FIGS. 3A-C are side pan views of the two video display assemblies shown in FIG. 1, connected to one another in linear, convex and concave positions, respectively.
Figure 3B:
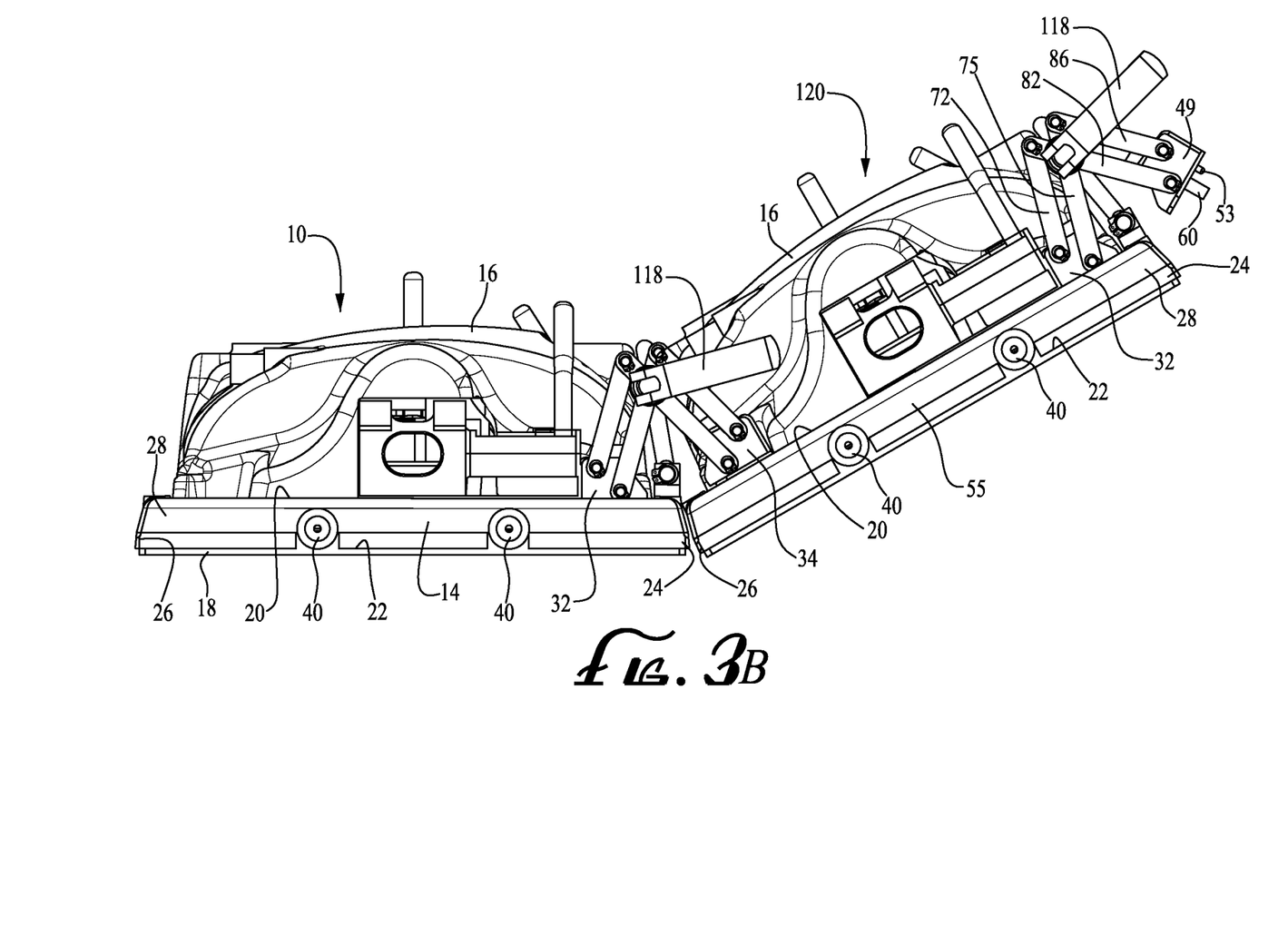
Figure 3C:
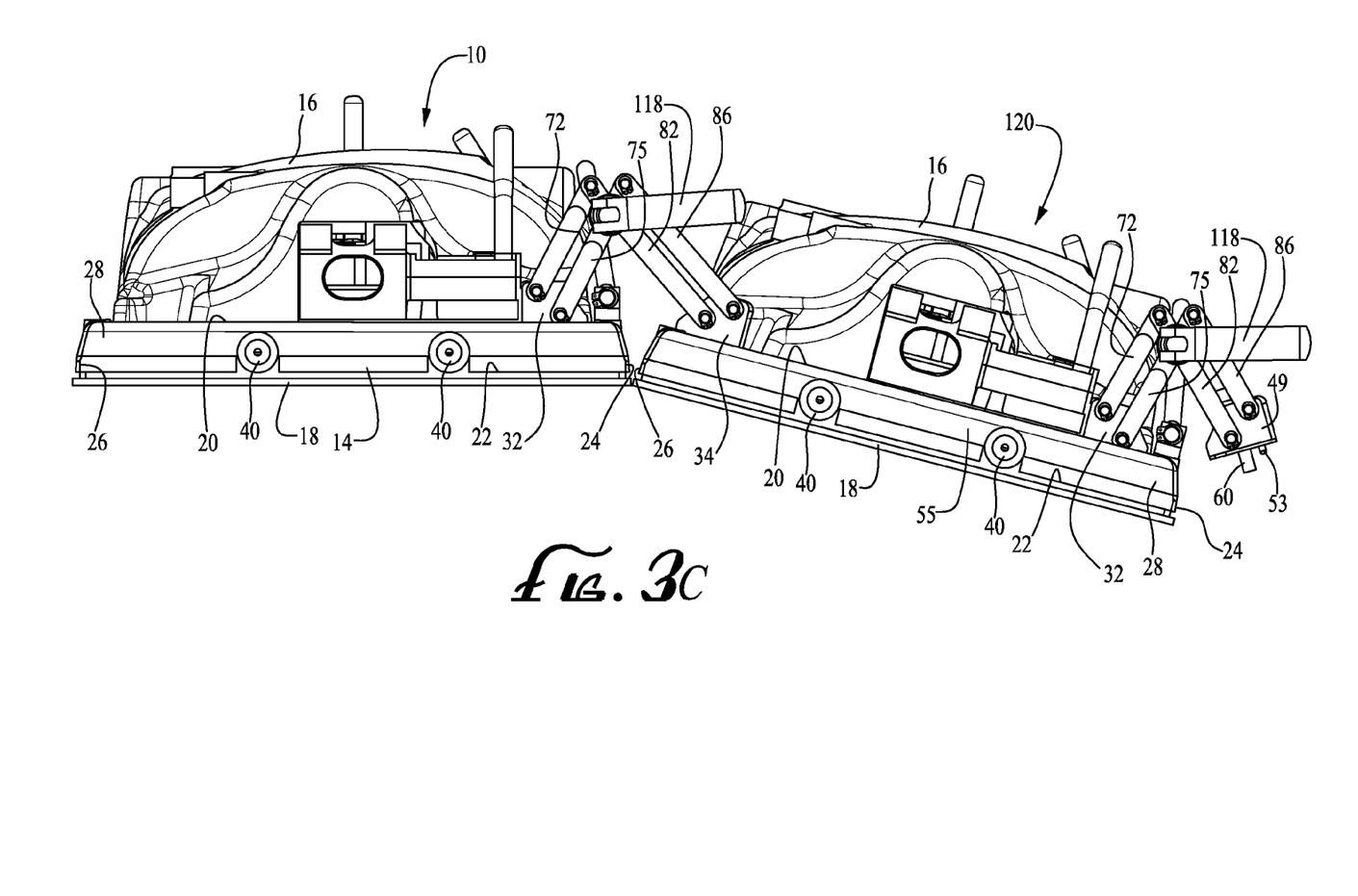

As seen in FIGS. 3A-C, it is a distinct advantage of the invention that once adjacent panels 14 and 55 are secured to one another by a hinged connector 32; it is possible to adjust the angle between the two video display assemblies 10 and 120. For example, the angle can be adjusted so that the video display modules form a straight line (FIG. 3A), form a convex angle (FIG. 3B) or form a concave angle (FIG. 3C). Once the desired angle is formed, the handle 118 can be tightened to secure the relative positions of the two video display modules. To realign the video display modules, the handle can be loosened, the angles readjusted, and the handle retightened.

In the embodiment shown in FIGS. 3A-C, the top surface 24 of the attachment panel 14 panel is connected to bottom surface 26 of the second attachment panel by a hinged connector 32, so that the angle between the first and second video display modules 14 and 120 can be varied. It can be readily appreciated, that a second pair of connectors can be secured in the bottom corners of the first panel in order to attach the bottom to the top of a third panel (not shown). Similarly connectors can be attached to the additional panels to connect still more panels. Additionally, the connectors can be secured along the side corners of the first panel, so that additional panels can be connected to the sides of other panels.

Figure 5:
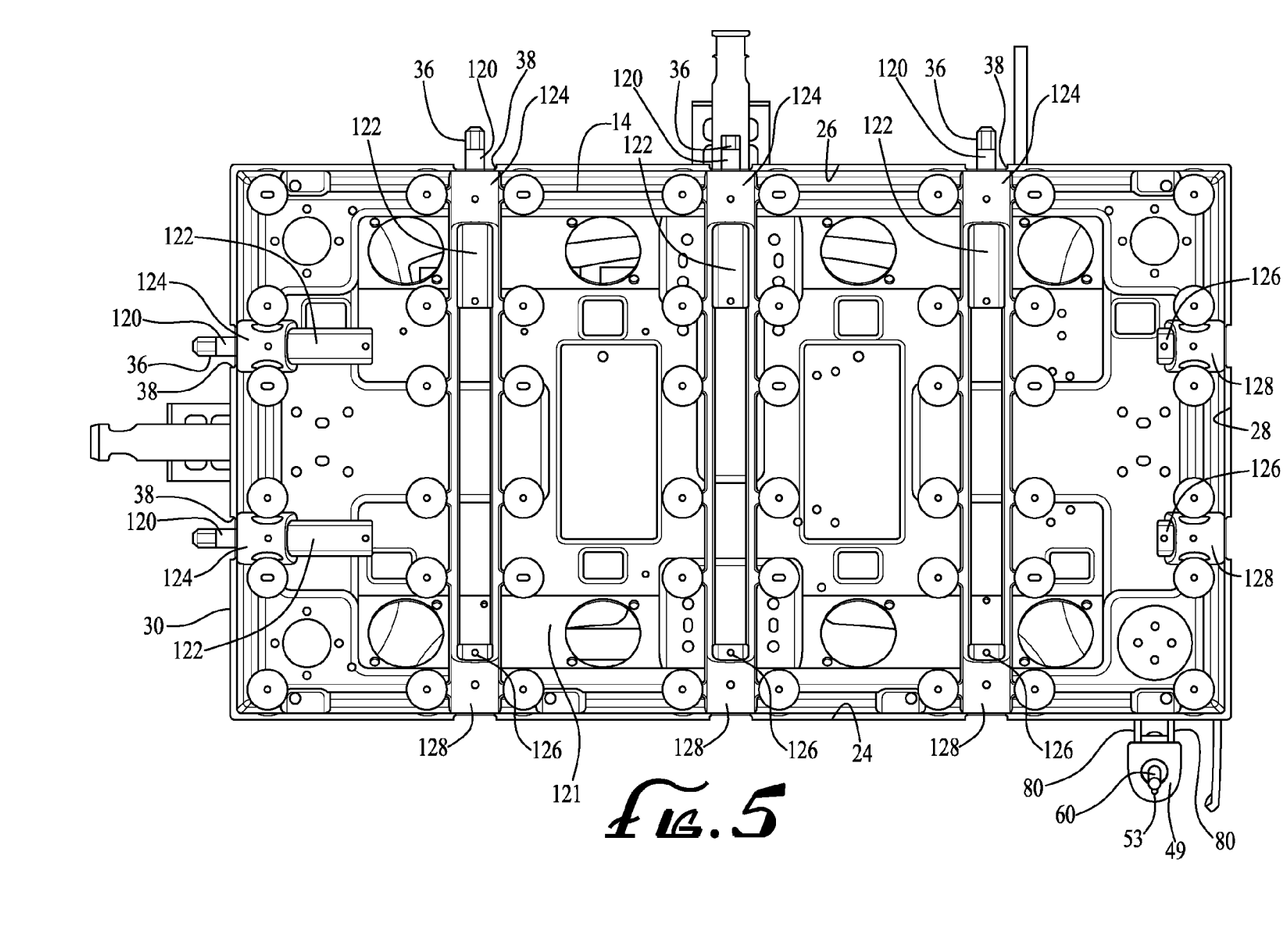
FIG. 5 is a front plan view of an attachment panel and associated elements in accordance with one aspect of the invention.

Turning additionally to FIG. 5, there is shown a front plan view of an attachment panel 14 in accordance with one aspect of the invention. In some aspects, the attachment panel 14 contains at least one retractable alignment pin 36 extending outwardly from an alignment pin opening 38 in the surface to be connected by connector 32 to a second attachment panel. In the embodiment shown, for example, in FIGS. 1 and 5, the top surface 26 contains three retractable alignment pins and the second side surface 30 contains two retractable alignment pins. The alignment pins are positioned so that they align with corresponding alignment pin receiving surfaces 40 in the side of the attachment panel to be attached. The attachment pin openings are dimensioned so that when the attachment pin is fully extended and the two panels are attached to one another, the attachment pin engages the receiving surfaces and the first and second panels are fixedly aligned in a straight line. When the alignment pin is retracted, it does not engage the second attachment panel and the angle between the two panels can be set by the connection hinge 32.

In the embodiment shown in FIGS. 3A-C, the top surface 24 of the attachment panel 14 panel is connected to bottom surface 26 of the second attachment panel by a hinged connector 32, so that the angle between the first and second video display modules can be varied. It can be readily appreciated, that a second pair of connectors can be secured in the bottom corners of the first panel in order to attach the bottom to the top of a third panel (not shown). Similarly connectors can be attached to the additional panels to connect still more panels. Additionally, the connectors can be secured along the side corners of the first panel, so that additional panels can be connected to the sides of other panels.

In some aspects, the alignment pin 36 contains a cylindrical body 120 threadably secured to a cylindrical housing 122 secured to the bottom surface 124 of the attachment plate 14. And in some aspects, one end of the alignment pin contains a convex end for engaging the alignment pin receiving surface 40. And as best seen in FIG. 1, in some embodiments, the one end of the alignment pin has a polygonal cross section, such as a hexagonal cross section, to facilitate extending and retracting the alignment pin. In some aspects, an alignment pin receiving surface member 126 is housed in a cylindrical housing 128 secured to the front surface 124 of the attachment plate 14. The One end of the alignment pin receiving surface member 126 is engaged by the alignment pin 36 and contains a concave receiving surface for engagement by the alignment pin.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

We claim:

1. A modular video display assembly, comprising:
   an attachment panel having a front surface, a back surface, and a perimeter surface;
   a video display attached to the front surface; and
   at least one hinged connector attached to the back surface, the at least one hinged connector comprising:
      a first base having:
         a first base body;
         a first first base hinge having a first end and a second end, the first end pivotably attached to the first base body; and
         a second first base hinge having a first end and a second end, the first end pivotably attached to the first base body; and
      a second base having:
         a second base body;
         a first second base hinge having a first end and a second end, the first end pivotably attached to the second base body; and
         a second second base hinge having a first end and a second end, the first end pivotably attached to the second base body, the second end of the first first base hinge pivotably attached to the second end of the first second base hinge and the second end of the second first base hinge pivotably attached to the second end of the second second base hinge, and the second first base hinge pivotably attached to the first second base hinge.

2. The modular video display assembly of claim 1 wherein the video display is an LED display, an LCD display, plasma display or an OLED display.

3. The modular video display assembly of claim 2 wherein the LED display comprises a plurality of LED tiles.

4. The modular video display assembly of claim 1 wherein:
   the first base body has planar opposing sides;
   the first end of the first first base hinge has spaced apart arms pivotably attached to the planar opposing sides of the first base body; and,
   the first end of the second first base hinge has spaced apart arms pivotably attached to the planar opposing sides of the first base body;
   the second base body has planar opposing sides;
   the first end of the first second base hinge has spaced apart arms pivotably attached to the planar opposing sides of the second base body; and
   the first end of the second second base hinge has spaced apart arms pivotably attached to the planar opposing sides of the second base body.

5. The modular video display assembly of claim 1 wherein the at least one hinged connector is attached adjacent the perimeter surface.

6. The modular video display assembly of claim 5, wherein the perimeter surface is comprised of a top surface, an opposing bottom surface, a first side surface and an opposing second side surface.

7. The modular video display assembly of claim 6 further comprising at least one retractable alignment pin extending outwardly from the top surface, the opposing bottom surface, the first side surface or the opposing second side surface.

8. The modular video display assembly of claim 7 further comprising at least one complementary alignment pin receiving surface, aligned with the at least one retractable alignment pin, extending inwardly from an opposing side surface.

9. The modular video display assembly of claim 1 wherein the first base body contains at least one locating peg extending downwardly from the first base body.

10. The modular video display assembly of claim 9 wherein the bottom of the attachment panel contains at least one locating pin hole positioned to receive the locating peg.

11. The modular video display assembly of claim 10 wherein the bottom on the attachment panel further comprises at least one attachment plate and the first base is attached to the attachment panel by the attachment plate.

12. The modular video display assembly of claim 11 wherein the attachment plate contains the at least one locating pin hole positioned to receive the locating peg and align the first base.

13. The modular video display assembly of claim 12 wherein the attachment plate contains two locating pin holes positioned to receive the locating peg and align the first base in alternate orientations.

* * * * *